(12) United States Patent
Lee et al.

(10) Patent No.: US 11,961,836 B2
(45) Date of Patent: Apr. 16, 2024

(54) FINFET VARACTOR QUALITY FACTOR IMPROVEMENT

(71) Applicant: Intel Corporation, Santa Clara, CA (US)

(72) Inventors: Hyung-Jin Lee, Portland, OR (US); Mark Armstrong, Portland, OR (US); Saurabh Morarka, Hillsboro, OR (US); Carlos Nieva-Lozano, Beaverton, OR (US); Ayan Kar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 923 days.

(21) Appl. No.: 16/147,205

(22) Filed: Sep. 28, 2018

(65) Prior Publication Data

US 2020/0105747 A1    Apr. 2, 2020

(51) Int. Cl.
*H01L 27/08* (2006.01)
*H01L 29/66* (2006.01)
*H01L 29/93* (2006.01)
*H10B 99/00* (2023.01)

(52) U.S. Cl.
CPC .... *H01L 27/0808* (2013.01); *H01L 29/66174* (2013.01); *H01L 29/93* (2013.01); *H10B 99/00* (2023.02)

(58) Field of Classification Search
CPC ............ H01L 27/0808; H01L 27/1052; H01L 29/66174; H01L 29/93; H01L 21/823431; H01L 21/823456; H01L 27/0886; H01L 29/94; H01L 21/823412; H01L 29/66795; H01L 29/7851; H01L 29/785; H01L 27/0924; H01L 29/7849; H01L 27/10826; H01L 27/10879
See application file for complete search history.

(56) References Cited

U.S. PATENT DOCUMENTS

| | | | |
|---|---|---|---|
| 9,087,860 B1* | 7/2015 | Banghart | H01L 21/26513 |
| 2014/0042547 A1* | 2/2014 | Khakifirooz | H01L 27/0805 |
| | | | 257/E27.06 |
| 2017/0154883 A1* | 6/2017 | Cheng | H01L 29/66174 |
| 2020/0235249 A1* | 7/2020 | Kar | H01L 29/66803 |

* cited by examiner

*Primary Examiner* — Shouxiang Hu
(74) *Attorney, Agent, or Firm* — Schwabe, Williamson & Wyatt, P.C.

(57) ABSTRACT

An integrated circuit structure comprises one or more fins extending above a surface of a substrate over an N-type well. A gate is over and in contact with the one or more fins. A second shallow N-type doping is below the gate and above the N-type well.

10 Claims, 13 Drawing Sheets

FINFET VARACTOR QUALITY FACTOR IMPROVEMENT

TECHNICAL FIELD

Embodiments of the disclosure are in the field of integrated circuit structures and, in particular, Finfet varactor quality factor improvement.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and state-of-the-art fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
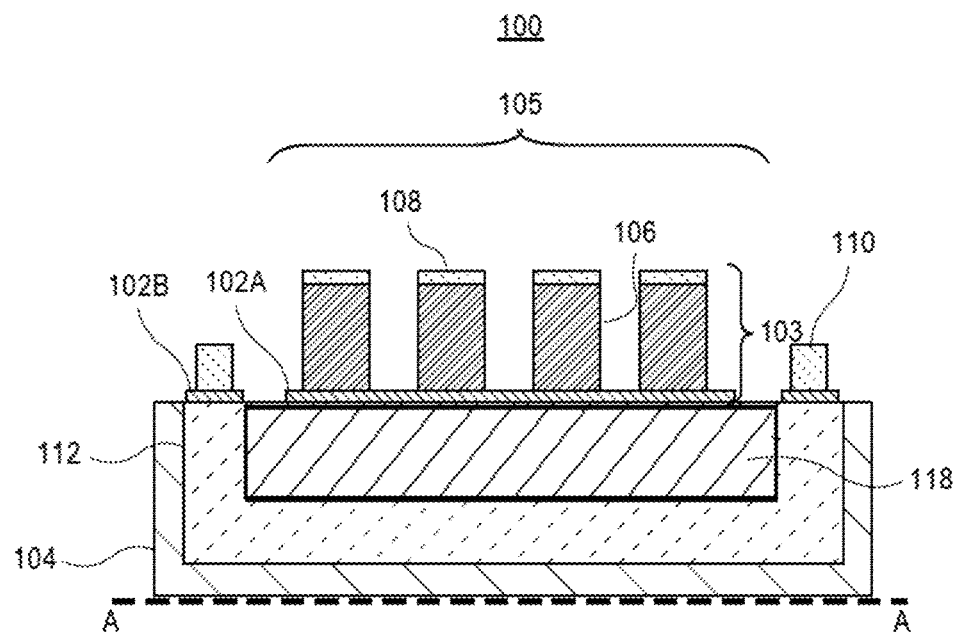
FIG. 1A illustrates a cross-sectional view of an accumulation mode FinFET varactor in accordance with one embodiment.

A FinFET varactor having improved quality factor are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to structures and architectures for fabricating a FinFET varactor having improved quality factor. Embodiments may include or pertain to one or more of radio frequency (RF) applications, secondary doping of fins, fin engineering, and system-on-chip (SoC) technologies.

A varactor is a device component often used in RF circuits to tune capacitance continuously as a function of an applied voltage, so it is often adapted in voltage controlled oscillator (VCO) circuits to provide a fine frequency tuning control by phase locked loop (PLL). The varactor has two parameters to consider; maximum capacitance to minimum capacitance ratio, and quality factor. The quality factor (Q) indicates the total energy stored in the reactance components over the energy loss by a lossy component, thus higher Q is preferable for high performance VCO design in respect to low phase noise and low power dissipation. While maximum capacitance to minimum capacitance ratio improves in technology, the quality factor is significantly limited or degraded by FinFET technology due to inherent fin structure. The degraded Q mainly limits the circuit implementation at higher frequency, and it is dominant limiting factor to support high frequency application such as high-speed serializer/deserializer (SerDes) and mmWave transceiver clock generation.

Previous solutions for the degraded Q in varactors have all been based on planar technologies where the resistance component was sufficient to not significantly degrade the quality factor. The major challenges were with poor capacitance tunability. Various ideas for improving the tenability have included accumulation mode vs inversion mode vs source-drain-bulk tied vs diode varactors. There have also been suggestions for optimizing the doping ratios in the channel and bulk regions. Apart from the use of analog varactors, VCOs have also lately been using digital varactors that use digitized capacitances instead of using the MOSFET for capacitance tuning at the cost of discrete frequency step causing phase noise degradation by quantization noise.

However, FinFETs being the workhorse of latest digital technology, need to have a varactor with improved Q for use in the RF technologies to obtain the benefits of FinFETs. Finfets, however, bring different challenges for varactors where the resistance between the gates through the narrow fin region becomes a bottleneck. Although attempts have been made to improve Q by increasing fin width and to optimize the tuning range of a varactor via threshold voltage optimization through gate work-function, it is believed no major improvements have been made to the resistance of a FinFET varactor.

In accordance with one or more embodiments described herein, methods and systems are provided to improve the resistance of a FinFET varactor in order to improve the Q-factor. According to the disclosed embodiments, a high performance Fin-FET-based accumulation mode varactor is provided using a dual N-type well doping methodology and/or differential fin engineering techniques. Both processes are compatible with current high-k metal-gate FIN-FET processes. Applications of such systems may include, but are not limited to, radio frequency (RF), or analog applications. Embodiments described herein may include non-planar structures that effectively reduce resistance and therefore improve varactor QR by integrating the FinFETS in unique architectures. One or more embodiments may be implemented to realize high performance voltage controlled oscillator (VCO) circuits for RF applications of future technology nodes.

Figure 1B:
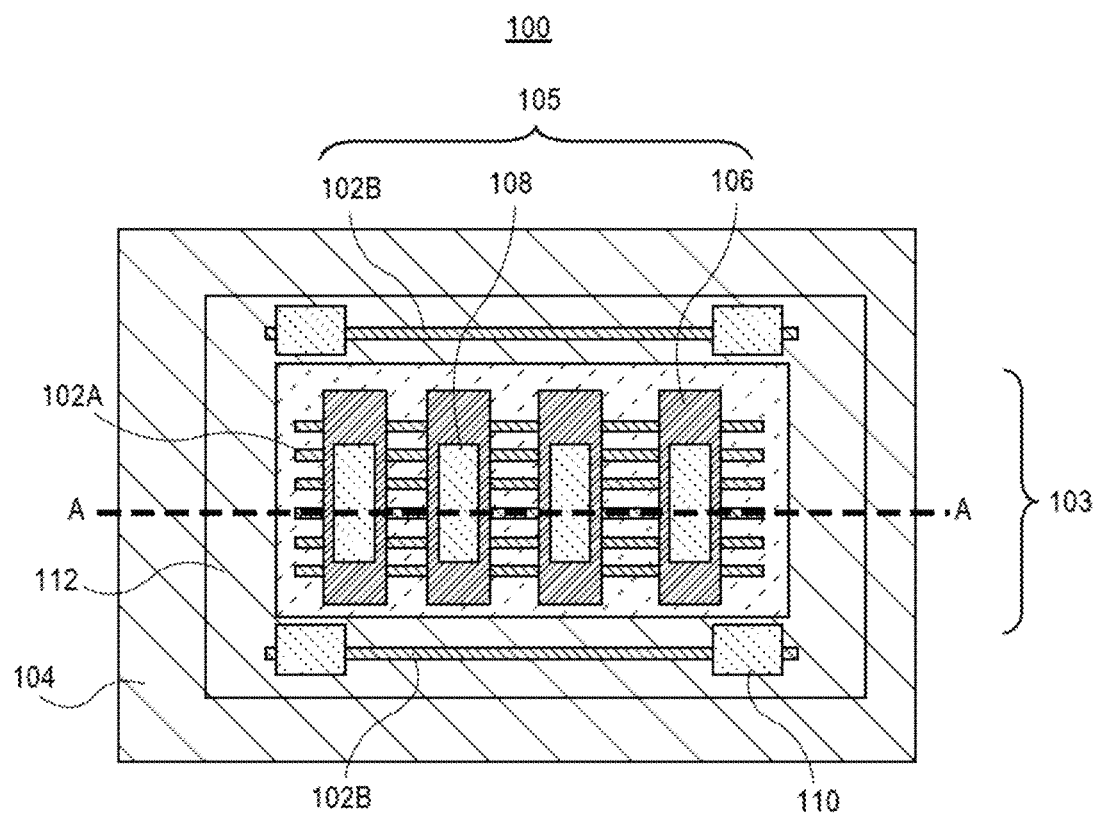
FIG. 1B illustrates a top view of the accumulation mode FinFET varactor and cross-section line A.

FIG. 1A illustrates a cross-sectional view of an accumulation mode FinFET varactor in accordance with one embodiment. FIG. 1B illustrates a top view of the accumulation mode FinFET varactor and cross-section line A. The FinFET varactor 100 comprises a substrate 104, which is P-type substrate in one embodiment, and an N-type well 112 is formed within the substrate 104. A plurality of fins 102A and 102B are along a first direction extending above the surface of a substrate 104. The fins 102A and 102B comprise a semiconductor material that protrudes outward from the substrate 104, where the protrusions are spaced apart from one another with an insulating layer (not shown) covering the protrusions uncovered by the gate. In one embodiment, fins 102A are formed in an area referred to as a fin region 105 over the N-type well 112.

A plurality of gates 106 are over the substrate 104 and in contact with (i.e., straddle or wrap-around) the fins 102A in a gated region 103, while fins 102B lie outside of the gated region 103. The gates 106 are along a second direction substantially orthogonal with the first direction of the fins 102A, and control the flow of charge carriers in a channel region (not shown) within the fins 102A. The gates 106 comprises a gate material layer that may be separated from the fins 102 by a gate dielectric layer (not shown). In various embodiments, the gate dielectric layer may comprise a silicon dioxide (e.g., $SiO_N$) layer or a high-k dielectric layer. In various embodiments, the gate material layer may comprise a poly-silicon layer or a metal gate layer (e.g., titanium nitride, aluminum, aluminum oxide, etc.).

Source and drain regions (not shown) are located along the fins 102A on opposite sides of each of the gates 106 and may be coupled together electrically to form a varactor. This coupling may be made by forming highly doped source and drain regions in a well of the same polarity (e.g., N+ source and drain regions in the N-type well 112). Gate contacts 108 are formed over and in contact with the gates 106, and N-type well contacts 110 are formed over fins 102B, which lie outside of the gate region 103. Signals of opposite polarity may be applied on alternating gates 106 and an N-Tap may be used as a virtual ground biased at a DC voltage determining differential capacitance between the positive and negative polarity gates.

According to a first aspect of the disclosed embodiments, the resistance of the FinFET varactor 100 may be improved through a secondary doping optimization of the fin region 105 below the gated region 103 of the fins 102A and above the N-type well 112 using an ion-implantation process to provide a second shallow N-type doping 118 above the N-type well 112. In one embodiment, the second shallow N-type doping 118 may have a doping concentration of approximately 2e18-7e18. In some embodiments the second shallow N-type doping 118 may have a doping depth of 70-120 nm.

Figure 2A:
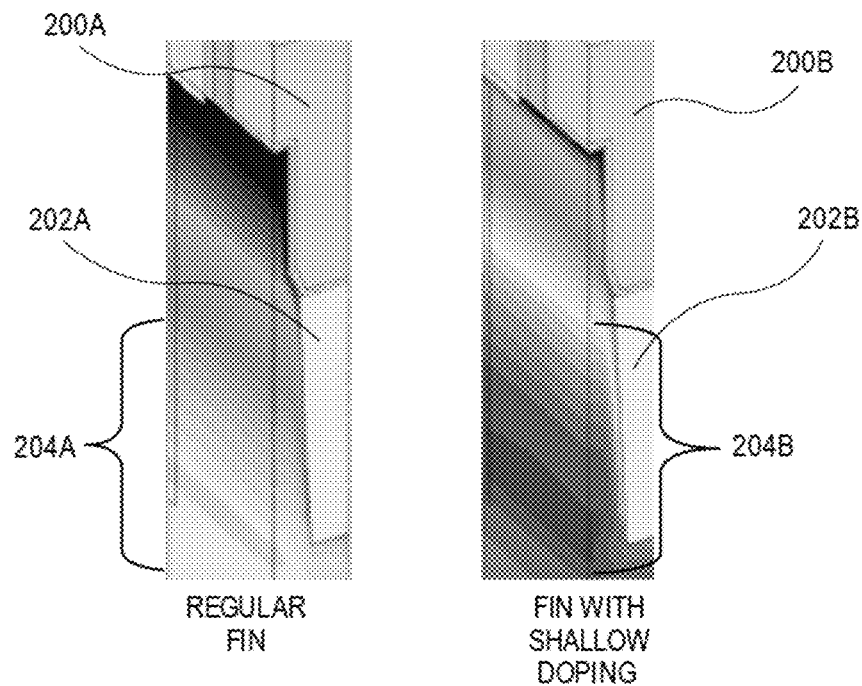
FIG. 2A is an angled cross-section view showing net doping difference between a regular fin (left) and a fin with secondary shallow doping (right).
Figure 2B:
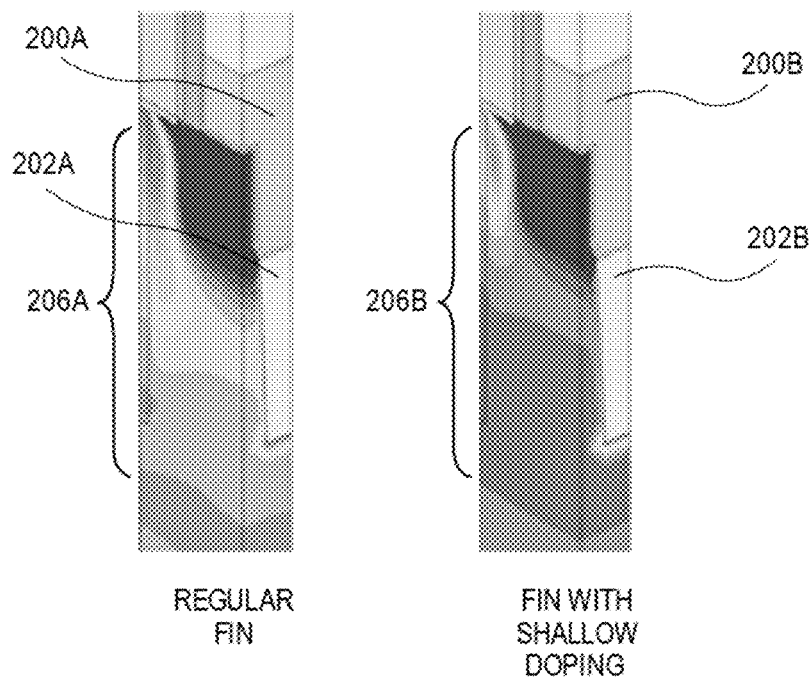
FIG. 2B is an angled cross-section view showing the conductivity difference between a regular fin and a fin having a secondary shallow doping.
Figure 2C:
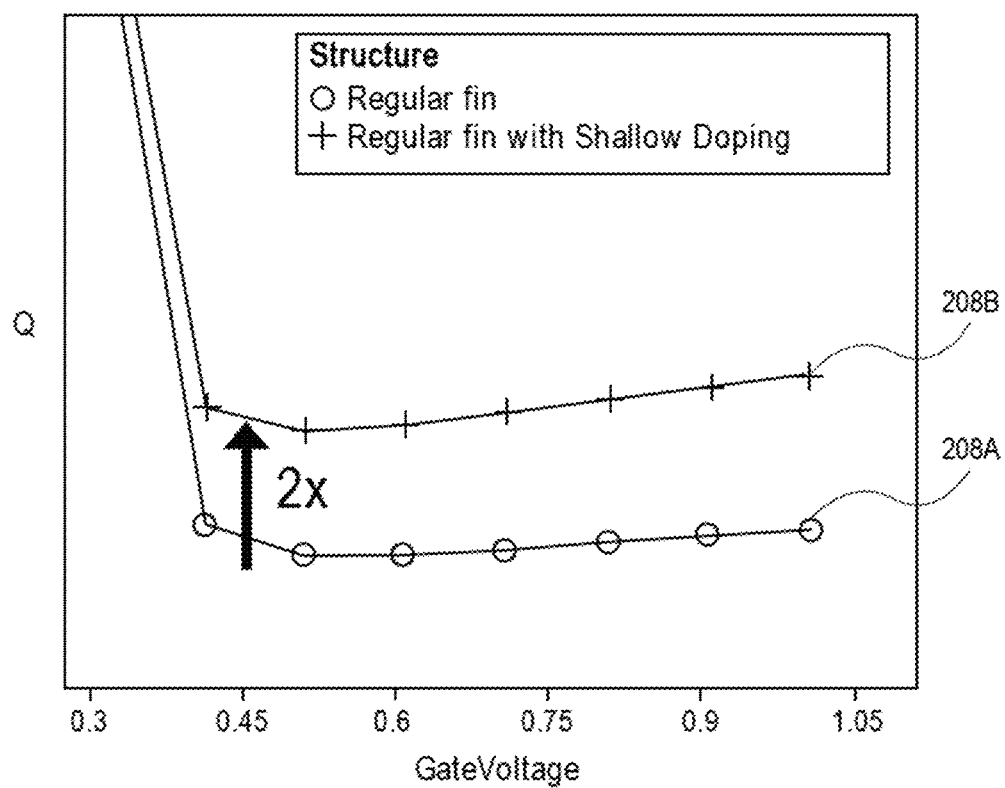
FIG. 2C is a plot showing Q versus differing gate voltage/bias for the regular fin and the fin with the secondary shallow doping.

The secondary shallow N-type doping 118 results in the finFET varactor 100 having a relatively higher Q, as shown in FIGS. 2A-2C.

FIGS. 2A-2C illustrates simulation data demonstrating an improvement in the minimum Q as a result of the secondary shallow N-type doping performed on the FinFET varactor 100. FIG. 2A is an angled cross-section view showing net doping difference between a regular fin 202A (left) and a fin with secondary shallow doping 202B (right). In FIG. 2A, gates 200A and 200B are shown over regular fin 202A and fin 202B, respectively. Regular fin 202A has a doping level 204A provided by the N-type well 112 only while fin 202B has a doping level 204B provided by the N-type well 112 plus the secondary shallow N-type doping 118. The darker shading of doping level 204B compared to doping level 204A correlates to a higher doping level.

FIG. 2B is an angled cross-section view showing the conductivity difference between the regular fin 202A and the fin 202B having the secondary shallow doping 202B. The regular fin 202A has conductivity 206A, while fin 202B has conductivity 206B, where darker shading of conductivity 206B correlates to higher conductivity.

FIG. 2C is a plot showing Q versus differing gate voltage/bias, where Q values 208A correspond to the regular fin and Q values 208B correspond to the fin 202B with the secondary shallow doping. Compared to the Q values 208A for regular fin 202A, the Q values 208B for fin 202B with the secondary shallow doping show a 2× minimum Q improvement for the FinFet varactor 100, as fin conductivity improves with additional doping.

According to a second aspect of the disclosed embodiments, the resistance of the FinFET varactor 100 may be improved through fin engineering techniques alone, or in addition to, secondary shallow doping. In one embodiment, a first fin engineering technique is to reduce fin height below the gated region to allow current to flow through a wider bulk region, while a second fin engineering technique improves the resistance of the FinFET varactor 100 by changing the fin profile by increasing the angle of the fin to widen the region for current flow.

Figure 3A:
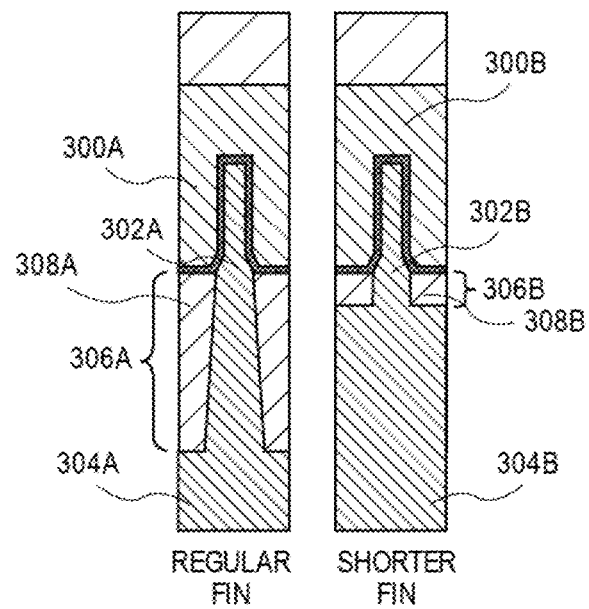
FIG. 3A is a cross-section view of a regular fin and gate (left) and a short fin having reduced fin height and gate (right).
Figure 3B:
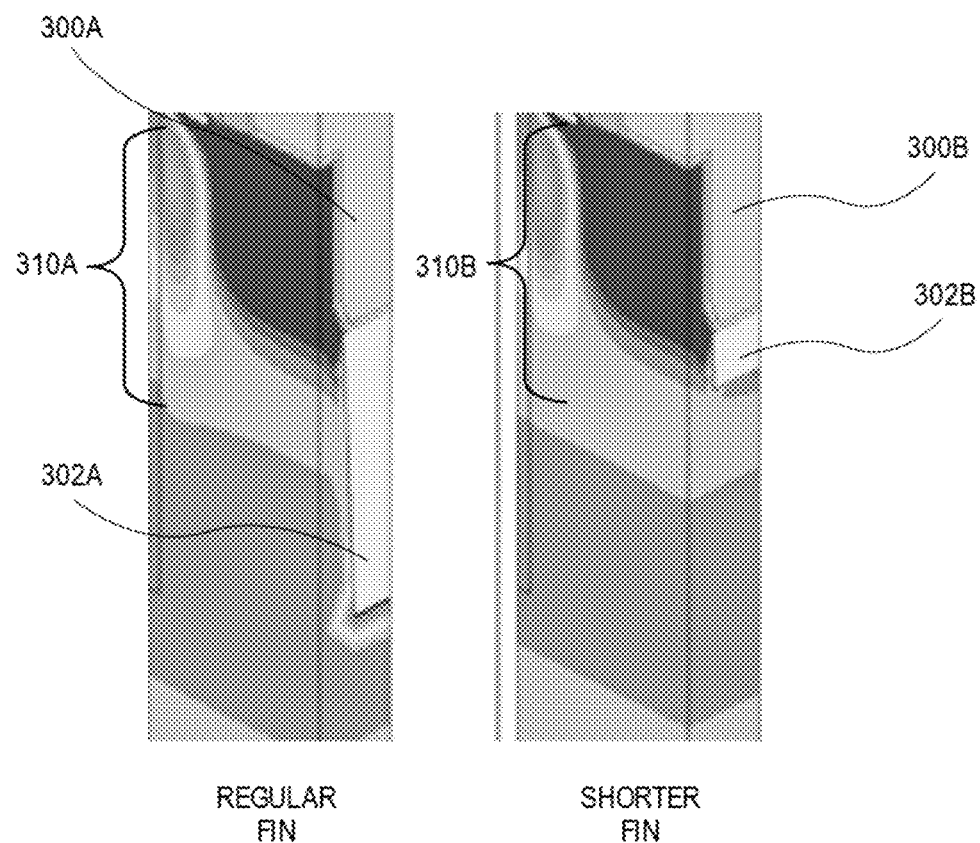
FIG. 3B is a cross-section view showing the conductivity difference between the regular fin and the short fin having reduced fin height.
Figure 3C:
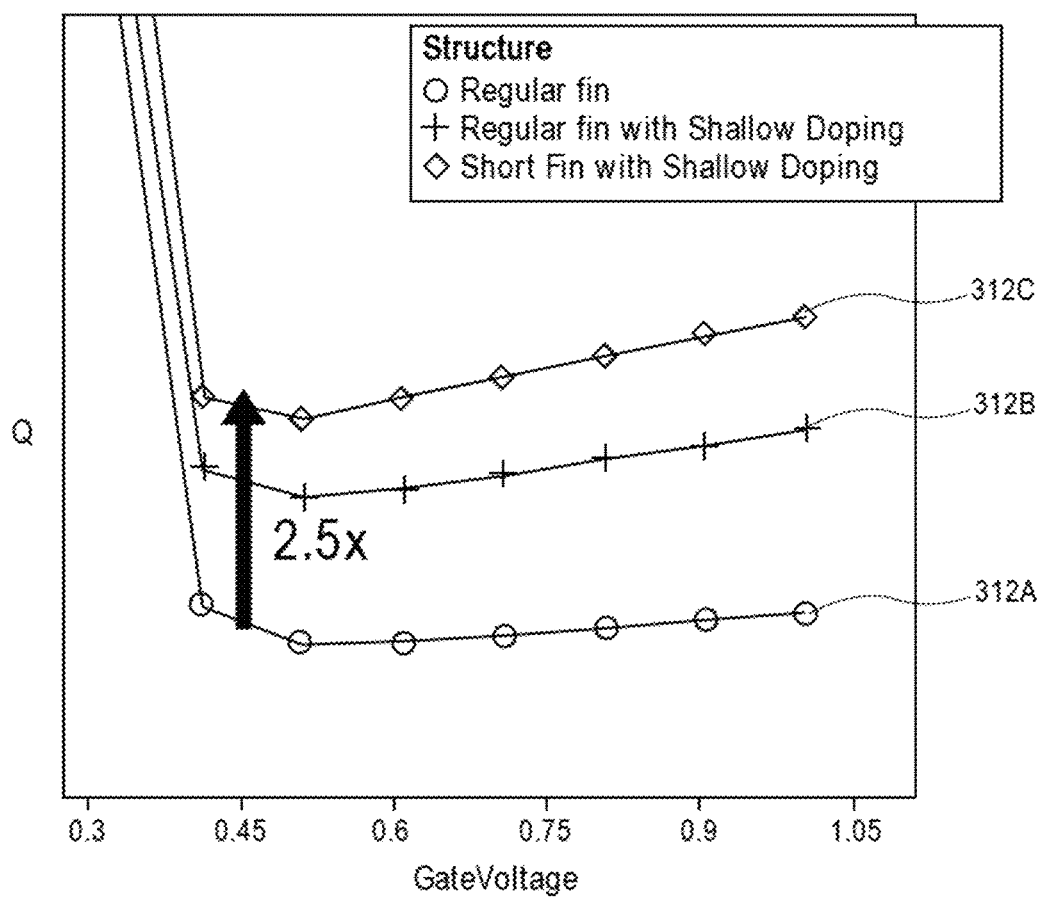
FIG. 3C is a plot showing Q versus differing gate voltage/bias for the regular fin, the regular fin with shallow doping, and the short fin with shallow doping.

FIGS. 3A-3C illustrates simulation data demonstrating an improvement in the minimum Q as a result of reducing fin height below the gated region of the FinFET varactor. FIG. 3A is a cross-section view of a regular fin 302A and gate 300A (left), and a short fin 302B having reduced fin height and gate 300B (right). Both the regular fin 302A and the short fin 302B extend between substrates 304A and 304B and gates 300A and 300B, respectively. An oxide 308A and 308B surrounds the regular fin 302A and the short fin 302B in-between the substrates 304A and 304B and gates 300A and 300B. Fin heights 306A and 306B are measured between the between substrates 304A and 304B gates 300A and 300B. As shown, short fin 302B has been engineered such that its fin height 306B is substantially less than fin height 306A of regular fin 302A, and therefore, less oxide 308B exists around the short fin 302B.

FIG. 3B is a cross-section view showing the conductivity difference between the regular fin 302A and the short fin 302B having reduced fin height. The regular fin 302A has conductivity 310A, while the short fin 302B has conductivity 310B, where darker shading of conductivity correlates to higher conductivity.

In one embodiment, short fin(s) 302B may be fabricated along with regular fin(s) 302A on the same substrate for other devices on a chip. The short fins 302B may also be implanted with a shallow n-type doping in addition to the N-type well 112 on which all NMOS sit.

FIG. 3C is a plot showing Q versus differing gate voltage/bias, where Q values 312A correspond to the regular fin 302A, Q values 312B correspond to the regular fin 302A with shallow doping, and Q values 312C correspond to the short fin 302B with shallow doping. Compared to the Q values 312A for regular fin 302A and Q values 312B for the regular fin 302A with shallow doping, Q values 312C corresponding to the short fin 302B with shallow doping show a net improvement of 2.5× in Q.

According to a third aspect of the disclosed embodiments, the resistance of the FinFET varactor 100 may be improved through fin engineering techniques alone, or in addition to, secondary shallow doping. In one embodiment, a first fin engineering technique is to reduce fin height below the gated region to allow current to flow through a wider bulk region, while a second fin engineering technique improves the resistance of the FinFET varactor 100 by changing the fin profile by increasing the angle of the fin to widen the region for current flow.

Figure 4A:
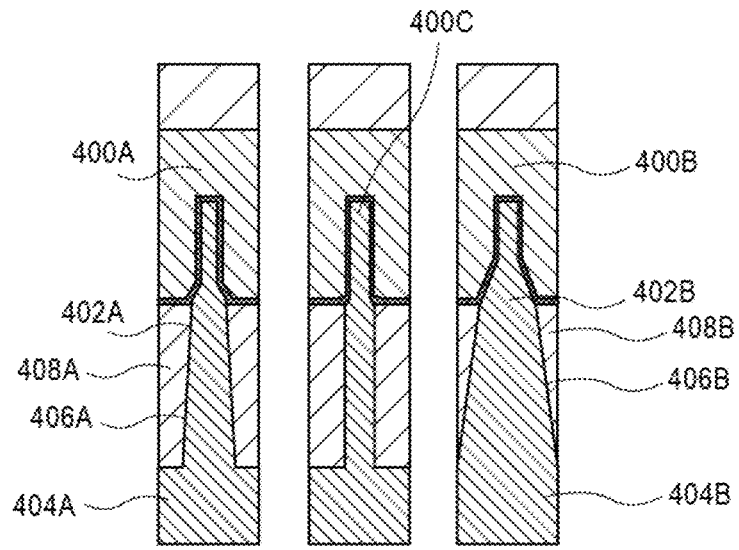
FIG. 4A is a cross-section view of a regular fin and gate (left), a flared fin and gate (right), and a straight fin and gate (middle).
Figure 4B:
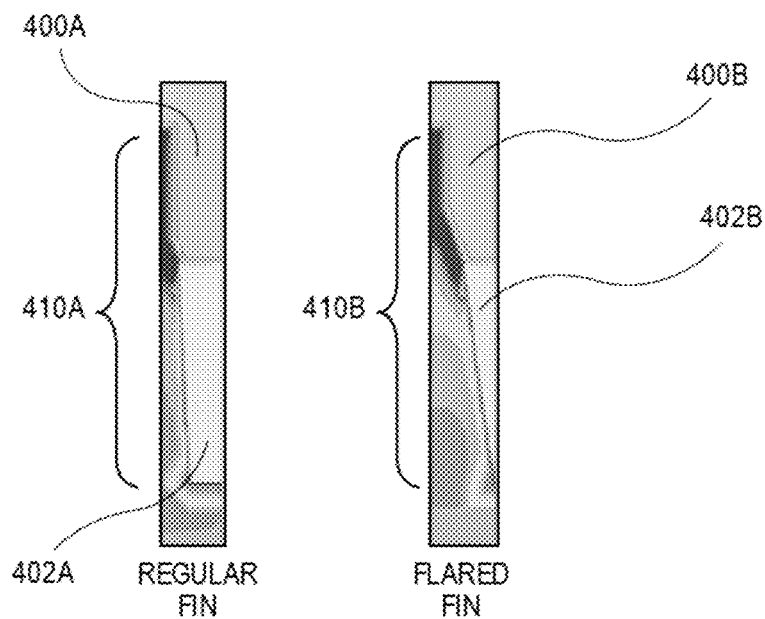
FIG. 4B is a cross-section view showing the conductivity difference between the regular fin and the flared fin having an increased flare angle.
Figure 4C:
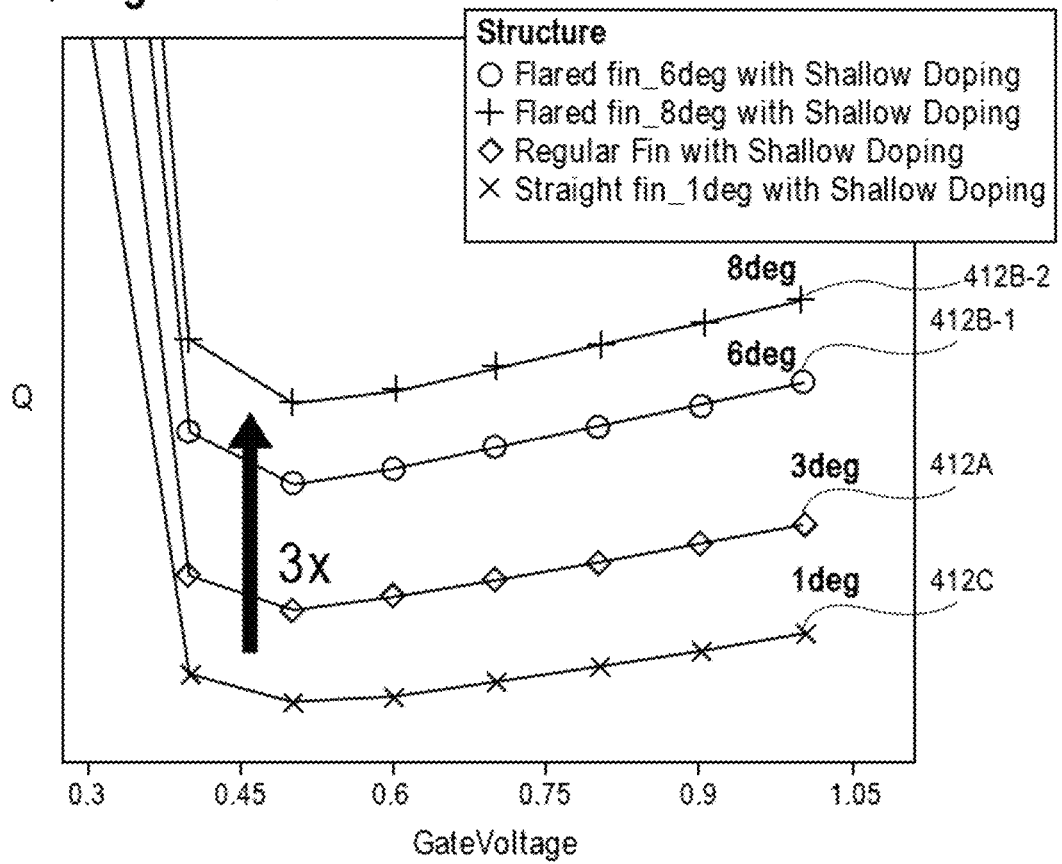
FIG. 4C is a plot showing Q versus differing gate voltage/bias for the regular fin with shallow doping, the straight fin with shallow doping, a flared fin having a 6 degree flare with shallow doping, and a flared fin having an 8 degree flare with shallow doping.

FIGS. 4A-4C illustrates simulation data demonstrating an improvement in the minimum Q as a result of the increasing the flare angle of the fin below the gated region of the FinFET varactor. FIG. 4A is a cross-section view of a regular fin 402A and gate 400A (left), a flared fin 402B and gate 400B (right), and a straight fin 400C and gate (middle). Oxides 408A, 408B and 408C surround the regular fin 402A, flared fin 402B and straight fin 400C, as described in FIG. 3A. While the straight fin 400C has a 0 degree flare angle, the regular fin 402A has a flare angle of approximately 1 degree. In accordance with the disclosed embodiments, flared fin 402B has been engineered to have an increased flare angle of approximately 5-10 degrees. Compared to the regular fin 402A (and the straight fin 400C), the flared fin 402B has a reduced amount of oxide 408A surrounding the flared fin 402B.

FIG. 4B is a cross-section view showing the conductivity difference between the regular fin 402A and the flared fin 402B having an increased flare angle. The regular fin 402A has conductivity 410A, while the flared fin 402B has conductivity 410B, where darker shading of conductivity correlates to higher conductivity. In one embodiment, flared fins 402B may be fabricated along with regular fins 402A on the same substrate for other devices on a chip. The flared fins 402B may also be implanted with a shallow n-type doping in addition to the N-type well 112.

FIG. 4C is a plot showing Q versus differing gate voltage/bias, where Q values 412A correspond to the regular fin 402A with shallow doping, Q values 412C correspond to the straight fin 402C with shallow doping, Q values 412B-1 correspond to a flared fin 402B having a 6 degree flare with shallow doping, and Q values 412B-2 correspond to a flared fin 402B having an 8 degree flare with shallow doping. Compared to the Q values 412A and 412C for regular fin 402A and straight fin 402C with shallow doping, Q values 412B-1 and 412B-2 have significantly higher Q. For example, flared fin 402B having an 8 degree flare with shallow doping shows a net improvement of 3× in Q. Consequently, higher varactor performance is obtained.

Broadly speaking, the process for fabricating the FinFET varactor 100 includes forming one or more fins that extend above a surface of a substrate over an N-type well; forming a gate over and in contact with the one or more fins; and forming a second shallow N-type doping below the gate and above the N-type well. The process of forming one more fins includes engineering the fins to include any combination of regular fins, short fins, and flared fins all on the same silicon.

Figure 5A:
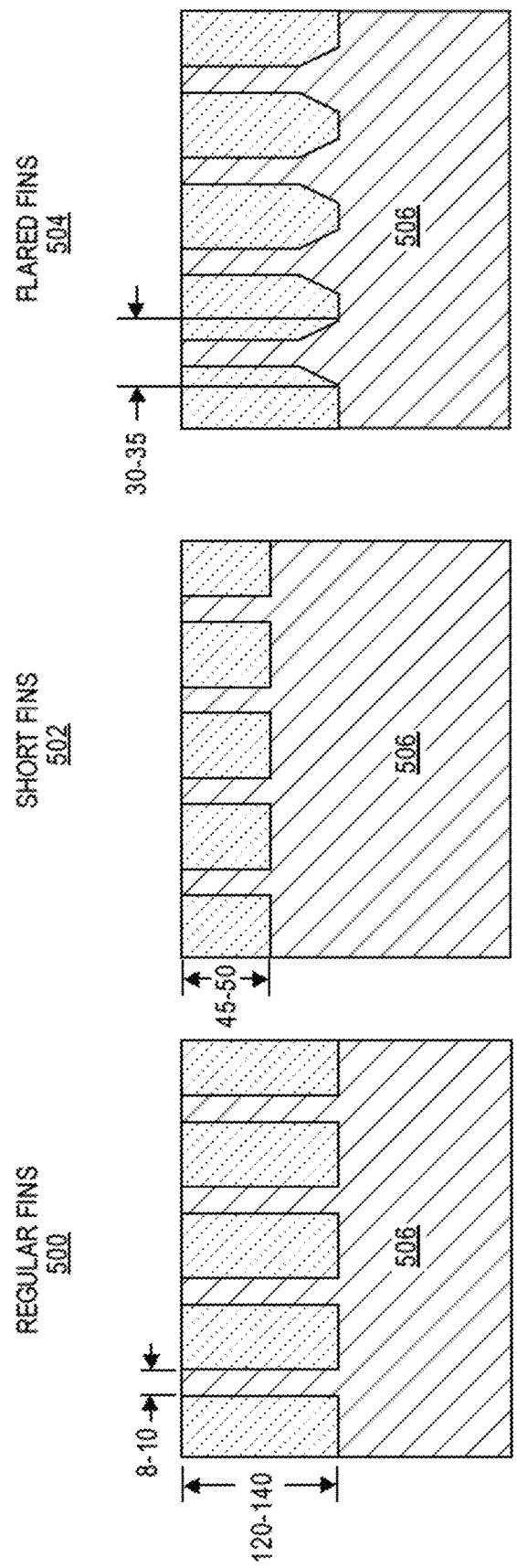
FIGS. 5A-5C are cross-section diagrams illustrating a process for fabricating the FinFET varactor.
Figure 5B:
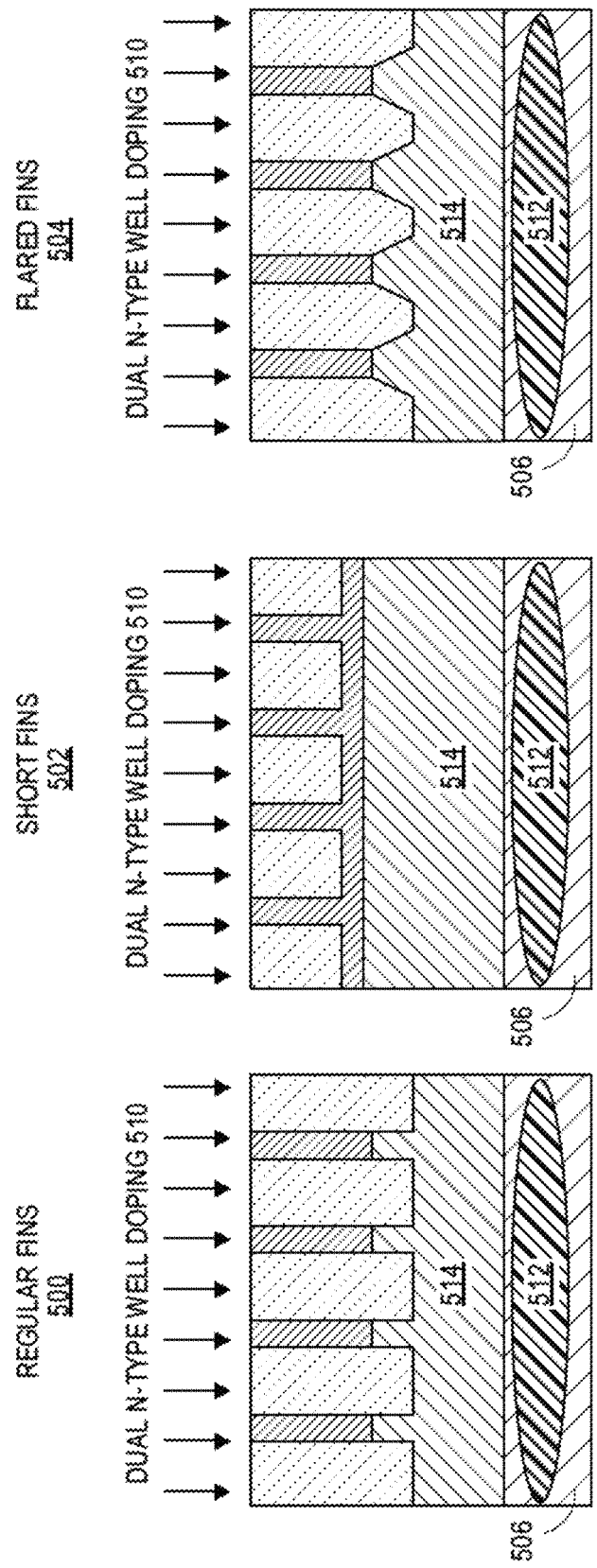
Figure 5C:
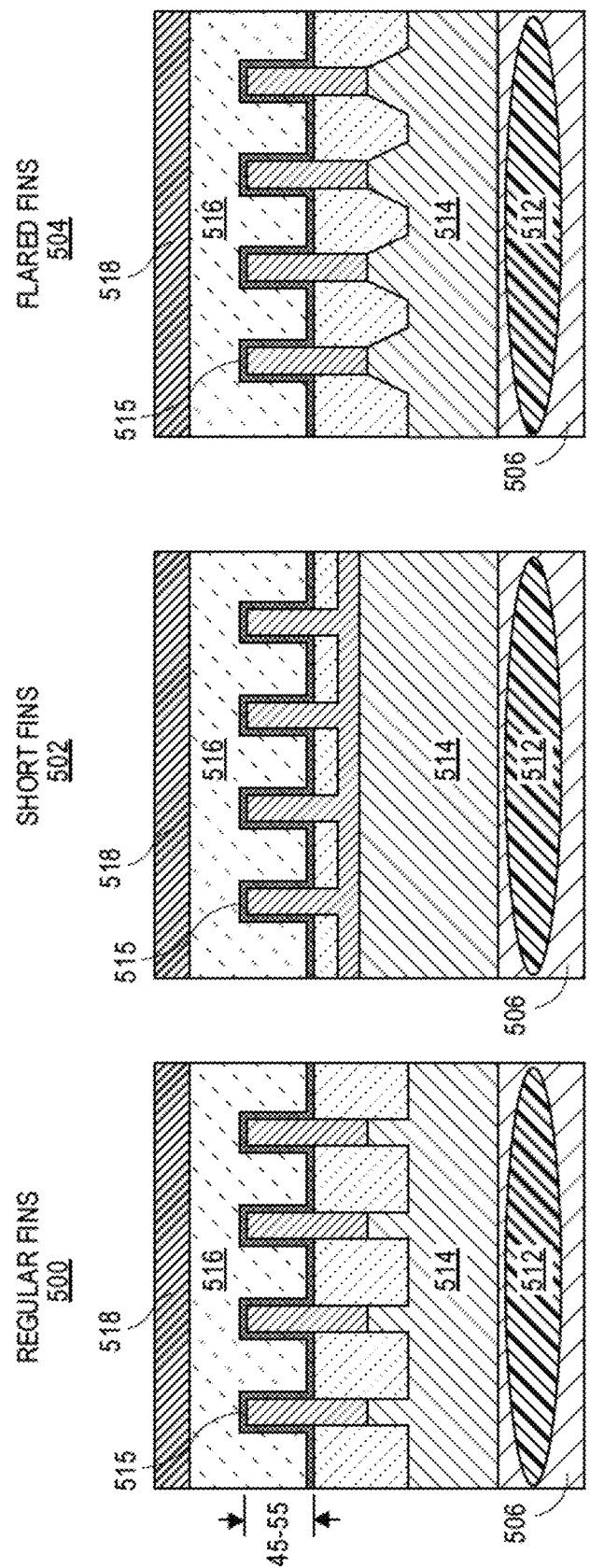

FIGS. 5A-5C are cross-section diagrams illustrating a process for fabricating the FinFET varactor. FIGS. 5A-5C illustrates an embodiment where regular fins, short fins, and flared fins are fabricated on the same silicon. However, in other embodiments, only one or only two types of fins may be fabricated on the same silicon.

FIG. 5A illustrates the fabrication process after regular fins 500, short fins 502, and flared fins 504 are fabricated on the same substrate 506. In one example embodiment, the regular fins 500 may be utilized for regular transistors, while the short 502 fins and flared fins 504 may be used to form one or more varactors. In one embodiment, the regular fins 500 and the flared fins 504 may have a height above the substrate 506 of approximately 120-140 nm, while the short fins may have a height of approximately 45-50 nm. In one embodiment, the regular fins 500, the short fins 502, and the flared fins 504 may have different or the same widths. For example, in one embodiment, the regular fins 500 and the short fins 502 may have a width of approximately 7-10 nm. In one embodiment, a top portion of the flared fins 504 may also have a width of approximately 7-10 nm. In one embodiment, flared portions of the flared fins 504 may have a flare angle of approximately 5-10 degrees and a width of 30-35 nm at the surface of the substrate 506.

FIG. 5B illustrates the fabrication process after a dual N-type well doping 510 is performed to form N-well doping 512 and shallow N-type doping 514 in the substrate 506 beneath the regular fins 500, the short fins 502, and the flared fins 504. In one embodiment, the first N-type doping forms N-well doping 512, while the second N-type doping forms, the shallow N-type doping 514. In one embodiment, the shallow N-type doping 514 has a doping concentration of 2e18-7e18 and a doping depth of 70-120 nm. In one embodiment the shallow N-type doping 514 extends to a portion of the regular fins 500 and flared portions of the flared fins 504, as shown.

FIG. 5C illustrates the fabrication process after a gate dielectric 515 and gates 516 are formed over the regular fins 500, the short fins 502, and the flared fins 504 and after contacts 518 are formed on the gates 516.

The FinFET varactor 100 has several advantages. For instance, The FinFET varactor 100 doesn't require any source drain diffusion process which reduces parasitics significantly in the RF operating region, and the use of FINFET technology for as a varactor ensures a good cap density. A shallow N-type doping technique improves the FinFET varactor 100 performance by helping reduce the resistance of the current path to the neighboring gate. Doping optimization may be achieved by adjusting doping energy and atomic weight through species, for n type (P,As,Sb). In addition, the dual fin engineering step reduces the fin height below the gated region to allow the current to flow through the wider bulk region. Similarly, changing the fin profile by increasing the angle of the fin widens the region for current flow.

Figure 6B:
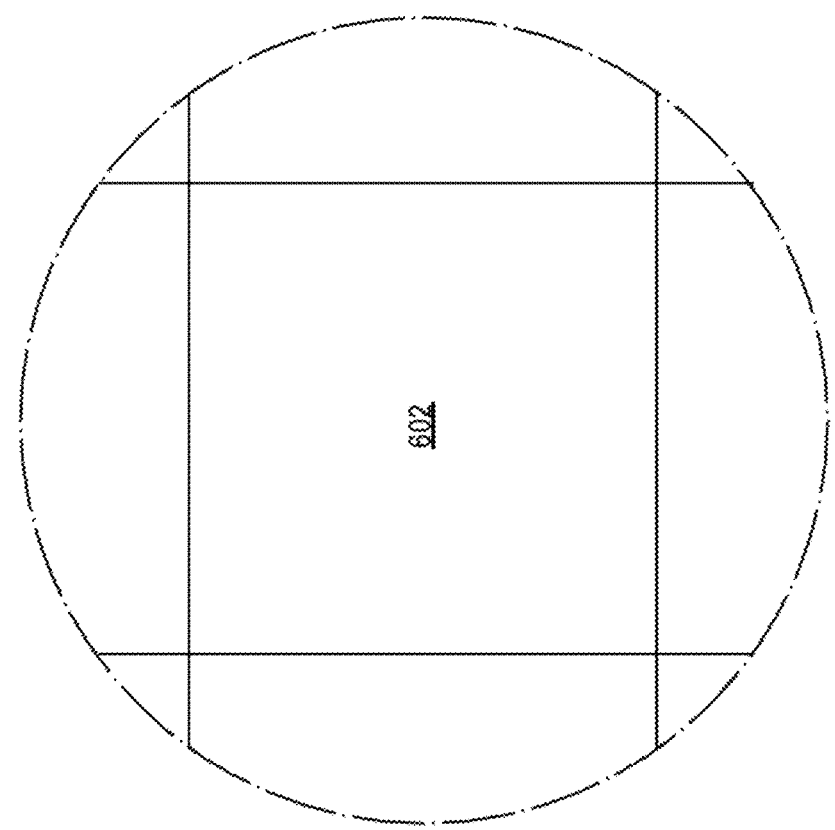
FIGS. 6A and 6B are top views of a wafer and dies that include one or more FinFET varactors having improved quality factor, in accordance with one or more of the embodiments disclosed herein.
Figure 6A:
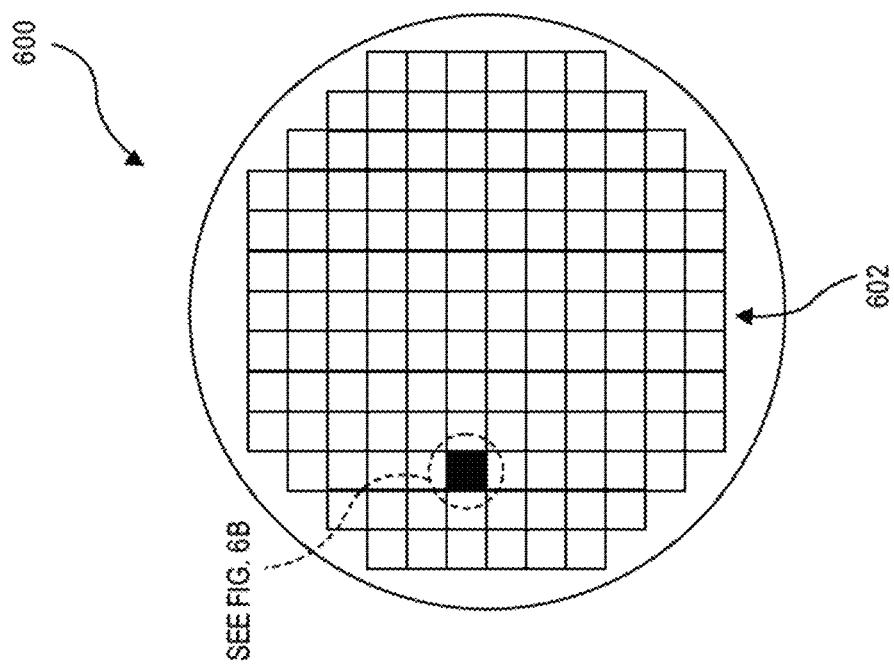

FIGS. 6A and 6B are top views of a wafer and dies that include one or more FinFET varactors having improved quality factor, in accordance with one or more of the embodiments disclosed herein.

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more FinFET varactors having improved quality factor, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
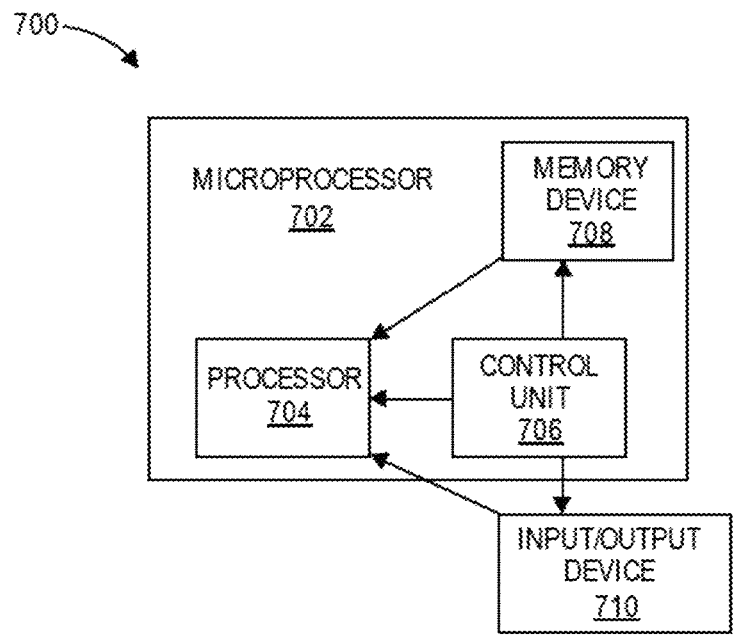
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more FinFET varactors having improved quality factor, such as those described herein.

Figure 8:
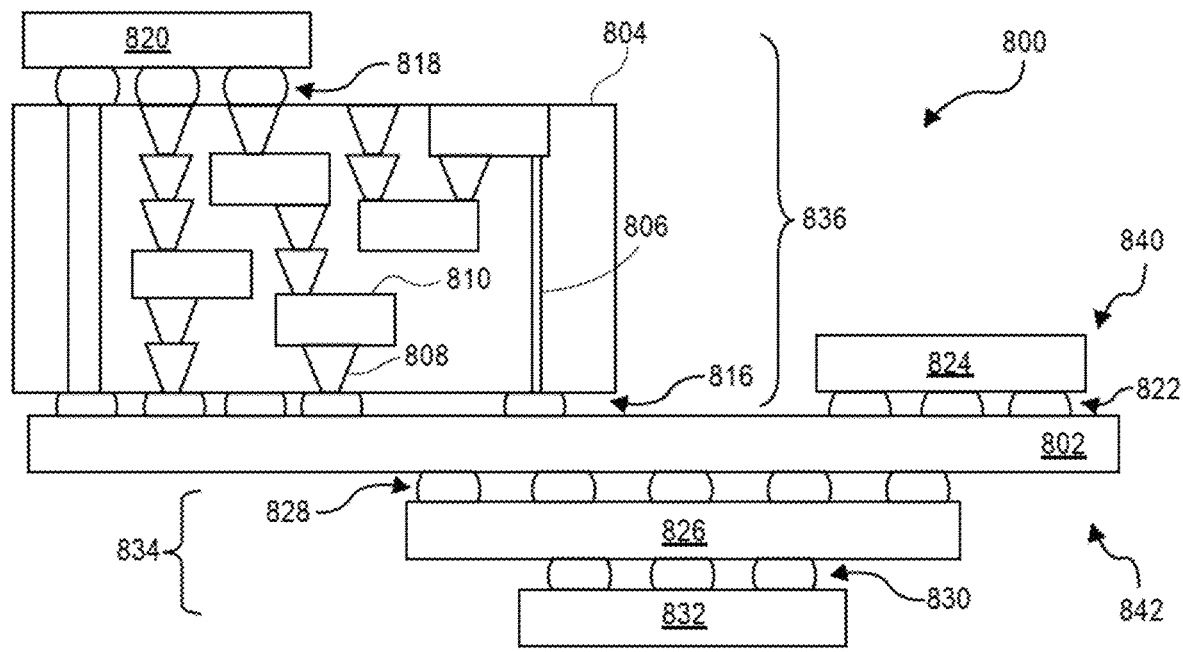
FIG. 8 is a cross-sectional side view of an integrated circuit (IC) device assembly that may include one or more FinFET varactors having improved quality factor, in accordance with one or more of the embodiments disclosed herein.

FIG. 8 is a cross-sectional side view of an integrated circuit (IC) device assembly that may include one or more FinFET varactors having improved quality factor, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of A FinFET varactor having improved quality factor, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 7B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
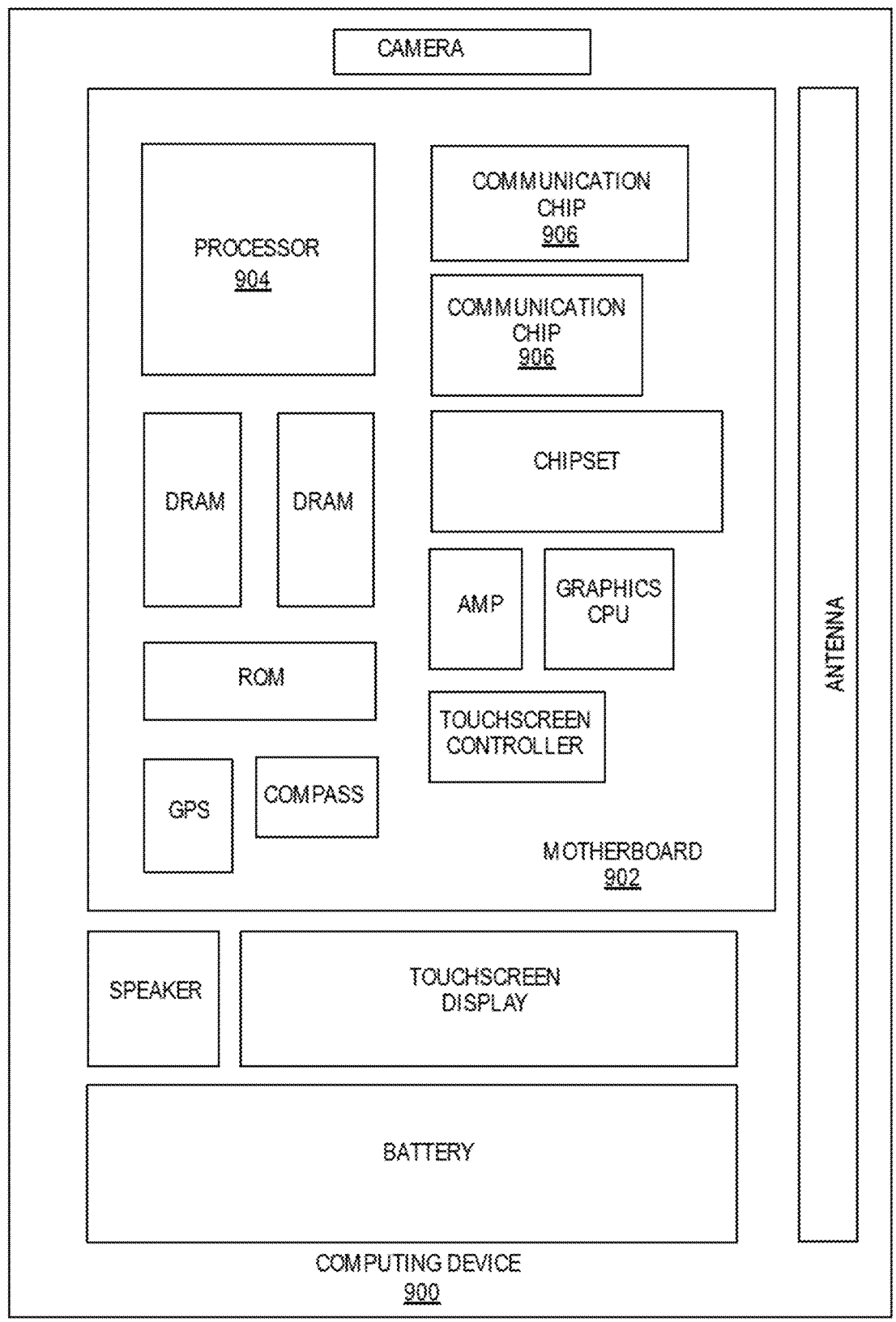
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more FinFET varactors having improved quality factor, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more FinFET varactors having improved quality factor, in accordance with implementations of embodiments of the disclosure.

In further implementations, another component housed within the computing device 900 may contain an integrated circuit die that includes one or more FinFET varactors having improved quality factor, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include A FinFET varactor having improved quality factor.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure comprises one or more fins extending above a surface of a substrate over an N-type well. A gate is over and in contact with the one or more fins. A second shallow N-type doping is below the gate and above the N-type well.

Example Embodiment 2

The integrated circuit structure of example embodiment 1, wherein the second shallow N-type doping has a doping concentration of 2e18-7e18.

Example Embodiment 3

The integrated circuit structure of example embodiment 1 or 2, wherein the second shallow N-type doping has a doping depth of 70-120 nm.

Example Embodiment 4

The integrated circuit structure of example embodiment 1, 2 or 3, wherein the one or more fins comprise a first set of fins having a first height and a second set of fins having a second height, where the second height is less than the first height.

Example Embodiment 5

The integrated circuit structure of example embodiment 4, wherein the first fin height and the second fin height are measured between the substrate and respective gates Example Embodiment 6

The integrated circuit structure of example embodiment 5, wherein the first fin height is 120-140 nm and the second fin height is 45-50 nm.

Example Embodiment 7

The integrated circuit structure of example embodiment 1, 2, 3, 4, 5 or 6, wherein the one or more fins comprise a first set of fins having a first flare angle and a second set of fins having a second flare angle, where the second flare angle is greater than the first flare angle.

Example Embodiment 8

The integrated circuit structure of example embodiment 7, wherein the first flare angle is 1 degree, and the second flare angle is 5-10 degrees.

Example Embodiment 9

The integrated circuit structure of example embodiment 8, wherein the first set of fins and a top portion of the second set of fins have a thickness of 7-10 nm.

Example Embodiment 10

The integrated circuit structure of example embodiment 9, wherein a flared portion the second set of fins have a width of 30-35 nm at a surface of the substrate.

Example Embodiment 11

A FinFET varactor comprises an N-type well within a substrate. A plurality of fins are along a first direction extending above the surface of a substrate over a first N-type well in a fin region. A plurality of gates are over the substrate and in contact with the fins in a gated region of FinFET varactor, the plurality of gates are along a second direction substantially orthogonal with the first direction. A second shallow N-type doping is in the fin region below the gated region and above the N-type well.

Example Embodiment 12

The FinFET varactor of example embodiment 11, wherein the second shallow N-type doping has a doping concentration of 2e18-7e18.

Example Embodiment 13

The FinFET varactor of example embodiment 11 or 12, wherein the second shallow N-type doping has a doping depth of 70-120 nm.

Example Embodiment 14

The FinFET varactor of example embodiment 11, 12 or 13, wherein the one or more fins comprise a first set of fins having a first height and a second set of fins having a second height, where the second height is less than the first height.

Example Embodiment 15

The FinFET varactor of example embodiment 14, wherein the first fin height and the second fin height are measured between the substrate and respective gates.

Example Embodiment 16

The FinFET varactor of example embodiment 15, wherein the first fin height is 120-140 nm and the second fin height is 45-50 nm.

Example Embodiment 17

The FinFET varactor of example embodiment 11, 12, 13, 14, 15 or 16, wherein the one or more fins comprise a first set of fins having a first flare angle and a second set of fins having a second flare angle, where the second flare angle is greater than the first flare angle.

Example Embodiment 18

The FinFET varactor of example embodiment 17, wherein the first flare angle is 1 degree, and the second flare angle is 5-10 degrees.

Example Embodiment 19

The FinFET varactor of example embodiment 18, wherein the first set of fins a top portion of the second set of fins have a thickness of 7-10 nm.

Example Embodiment 20

The FinFET varactor of example embodiment 19, wherein a flared portion the second set of fins have a width of 30-35 nm at a surface of the substrate

Example Embodiment 21

A method of fabricating a memory device comprises forming one or more fins extending above a surface of a substrate over an N-type well. A gate is formed over and in contact with the one or more fins. A second shallow N-type doping is formed is below the gate and above the N-type well.

Example Embodiment 22

The method of example embodiment 21, further comprising forming the second shallow N-type doping with a doping concentration of 2e18-7e18.

Example Embodiment 23

The method of example embodiment 21 or 22, further comprising forming the second shallow N-type doping at a doping depth of 70-120 nm.

Example Embodiment 24

The method of example embodiment 21, 22 or 23, further comprising forming the one or more fins to comprise a first set of fins having a first height and a second set of fins having a second height, where the second height is less than the first height.

Example Embodiment 25

The method of example embodiment 21, 22, 23 or 24, further comprising forming the one or more fins to comprise a first set of fins having a first flare angle and a second set of fins having a second flare angle, where the second flare angle is greater than the first flare angle.

What is claimed is:

1. An integrated circuit structure, comprising:
   a plurality of fins extending above a surface of a substrate along a first direction, the plurality of fins spaced apart from one another;
   a gate over the plurality of fins, the gate along a second direction substantially orthogonal with the first direction;
   an insulating layer that surrounds and is in contact with respective ones of the plurality of fins in-between the substrate and the gate;
   an N-type well located in the substrate below the plurality of fins; and
   an N-type doping in the substrate between the plurality of fins and the N-type well, the N-type doping extending vertically from the substrate to only a portion a height of the respective ones of the plurality of fins that extend above the surface of the substrate and below the gate, wherein the N-type doping has a doping concentration of 2e18-7e18.

2. The integrated circuit structure of claim 1, wherein the second N type doping has a doping depth of 70-120 nm.

3. The integrated circuit structure of claim 1, wherein the plurality of fins comprise a first set of fins having a first fin height and a second set of fins having a second fin height, where the second fin height is less than the first fin height.

4. The integrated circuit structure of claim 3, wherein the first fin height and the second fin height are measured between the substrate and respective gates.

5. The integrated circuit structure of claim 4, wherein the first fin height is 120-140 nm and the second fin height is 45-50 nm.

6. A FinFET varactor, comprising:
   an N-type well within a substrate;
   a plurality of fins along a first direction extending above a surface of the substrate over the N-type well, the plurality of fins spaced apart from one another;
   a plurality of gates over the plurality of fins that extend above the surface of a substrate, the plurality of gates along a second direction substantially orthogonal with the first direction;
   an insulating layer that surrounds and is in contact with respective ones of the plurality of fins in-between the substrate and the plurality of gates; and
   an N-type doping in the substrate between the plurality of fins and the N-type well, the N-type doping extending vertically from the substrate to only a portion a height of the respective ones of the plurality of fins that extend above the surface of the substrate and below the plurality of gates, wherein the N-type doping has a doping concentration of 2e18-7e18.

7. The FinFET varactor of claim 6, wherein the N-type doping has a doping depth of 70-120 nm.

8. The FinFET varactor of claim 6, wherein the plurality of fins comprise a first set of fins having a first fin height and a second set of fins having a second fin height, where the second fin height is less than the first fin height.

9. The FinFET varactor of claim 8, wherein the first fin height and the second fin height are measured between the substrate and respective gates.

10. The FinFET varactor of claim 9, wherein the first fin height is 120-140 nm and the second fin height is 45-50 nm.

* * * * *